United States Patent
Lai et al.

(10) Patent No.: US 8,802,457 B2
(45) Date of Patent: Aug. 12, 2014

(54) BACKSIDE SURFACE TREATMENT OF SEMICONDUCTOR CHIPS

(75) Inventors: Chih-Yu Lai, Tainan (TW); Cheng-Ta Wu, Shueishang Township (TW); Kai-Chun Hsu, Yonghe (TW); Yeur-Luen Tu, Taichung (TW); Ching-Chun Wang, Tainan (TW); Chia-Shiung Tsai, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 384 days.

(21) Appl. No.: 13/205,179

(22) Filed: Aug. 8, 2011

(65) Prior Publication Data

US 2013/0040446 A1    Feb. 14, 2013

(51) Int. Cl.
*H01L 21/00* (2006.01)
*H01L 21/46* (2006.01)
*H01L 21/322* (2006.01)

(52) U.S. Cl.
USPC ............... 438/22; 438/24; 438/45; 438/459; 438/473

(58) Field of Classification Search
USPC .................... 438/22, 24, 45, 57, 459, 473
See application file for complete search history.

(56) References Cited

U.S. PATENT DOCUMENTS

| | | | |
|---|---|---|---|
| 2005/0205996 A1* | 9/2005 | Usui et al. | 257/744 |
| 2008/0079108 A1* | 4/2008 | Hsu et al. | 257/460 |
| 2010/0176494 A1* | 7/2010 | Chen | 257/621 |
| 2011/0003424 A1* | 1/2011 | De Ceuster et al. | 438/71 |
| 2011/0306188 A1* | 12/2011 | Kawai et al. | 438/482 |

\* cited by examiner

*Primary Examiner* — Hsien Ming Lee
(74) *Attorney, Agent, or Firm* — Slater and Matsil, L.L.P.

(57) ABSTRACT

A method includes performing a grinding to a backside of a semiconductor substrate, wherein a remaining portion of the semiconductor substrate has a back surface. A treatment is then performed on the back surface using a method selected from the group consisting essentially of a dry treatment and a plasma treatment. Process gases that are used in the treatment include oxygen ($O_2$). The plasma treatment is performed without vertical bias in a direction perpendicular to the back surface.

20 Claims, 3 Drawing Sheets

BACKSIDE SURFACE TREATMENT OF SEMICONDUCTOR CHIPS

BACKGROUND

Backside illumination (BSI) image sensor chips are replacing front side illumination sensor chips for their higher efficiency in capturing photons. In the formation of the BSI image sensor chips, image sensors and logic circuits are formed on a silicon substrate of a wafer, followed by the formation of an interconnect structure on a front side of the silicon substrate. The interconnect structure includes a plurality of metal layers including bottom metal layer M1 through top metal layer Mtop. A passivation layer is then formed over the interconnect structure.

The formation of image sensor chips also involves a backside grinding, a p-type impurity implantation, and a steam anneal. The process is then continued to form backside contact pads, color filters, lenses, and the like, on the backside of the silicon substrate.

The steam anneal requires a high thermal budget, which adversely affects the pixel performance of the photo image sensors. When pixel sizes become increasingly smaller, the dark currents of the pixels become increasingly more important, and hence the adverse effect of the steam anneal becomes more severe.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A method of performing treatments to backside illumination (BSI) image sensor wafers/chips is provided in accordance with various embodiments. The intermediate stages of the treatments are illustrated. The variations of the embodiments are discussed. Throughout the various views and illustrative embodiments, like reference numbers are used to designate like elements.

Figure 1:
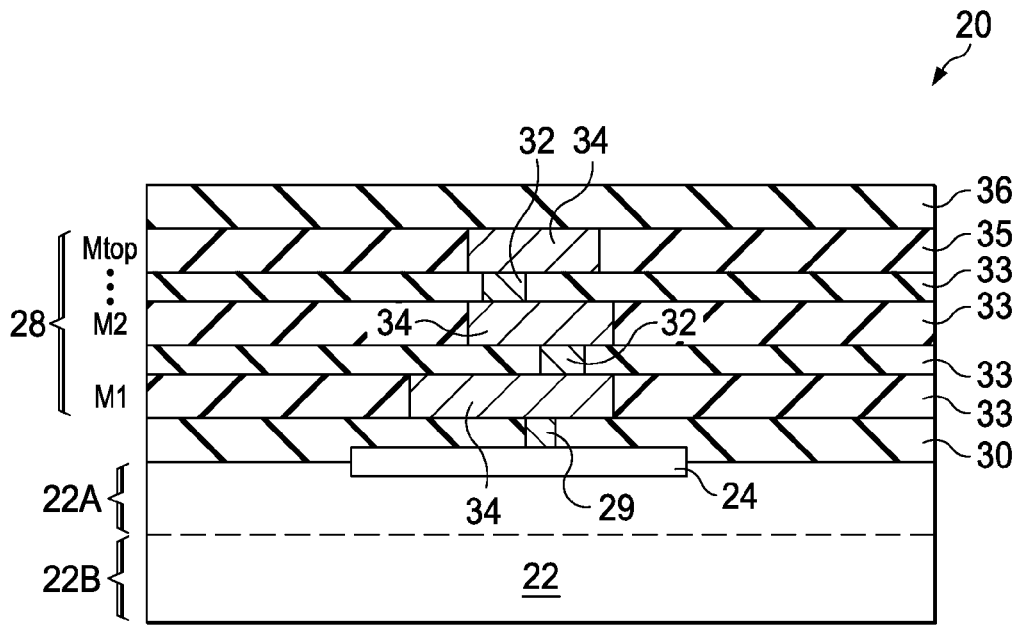
FIGS. 1 through 5 are cross-sectional views of intermediate stages in the manufacturing of a backside illumination (BSI) image sensor wafer in accordance with various embodiments.

FIG. 1 illustrates image sensor wafer 20, which includes semiconductor substrate 22. In an embodiment, semiconductor substrate 22 is a crystalline silicon substrate, although it may be formed of other semiconductor materials. Image sensors 24, which may include a photo-sensitive transistor or a photo-sensitive diode, are formed at the front surface of semiconductor substrate 22. Image sensors 24 are capable of converting light to electrical signals. In an embodiment, semiconductor substrate 22 includes a high-quality epitaxy layer 22A, which is epitaxially grown from semiconductor substrate 22B, wherein epitaxy layer 22A and semiconductor substrate 22B may be formed of a same semiconductor material.

Interconnect structure 28 is formed over semiconductor substrate 22, and is used to electrically connect to the devices (such as image sensors 24) in image sensor wafer 20. Interconnect structure 28 includes interlayer dielectric (ILD) 30 formed over semiconductor substrate 22, wherein contact plug 29 is formed in ILD 30.

The metal layers are marked as M1, M2 . . . and Mtop, wherein metal layer M1 is the bottom metal layer of interconnect structure 28, and metal layer Mtop is the top metal layer of interconnect structure 28. The metal layers include metal lines/pads 34 and vias 32 in dielectric layers 36. Image sensors 24 may be electrically coupled to metal lines/pads 34 and vias 32 in metal layers M1 through Mtop. In an embodiment, dielectric layers 33 and 35, in which the metal lines 34 and vias 32 of metal layers M1 through Mtop are formed, are low-k dielectric layers having low k values, for example, lower than about 3.0 or lower than 2.5. In alternative embodiments, dielectric layers 33, in which the metal lines 34 and vias 32 of metal layers M1 through M(top-1) are formed, are low-k dielectric layers, while dielectric layer 35, in which top metal layer Mtop is located, is a non-low-k dielectric layer have a k value greater than 3.9. Passivation layer 36 is formed over top metal layer Mtop and dielectric layer 35. In an embodiment, passivation layer 36 is formed of an oxide such as un-doped silicate glass (USG), or a composite layer comprising a silicon oxide layer and a silicon nitride layer on the silicon oxide layer.

Figure 2:
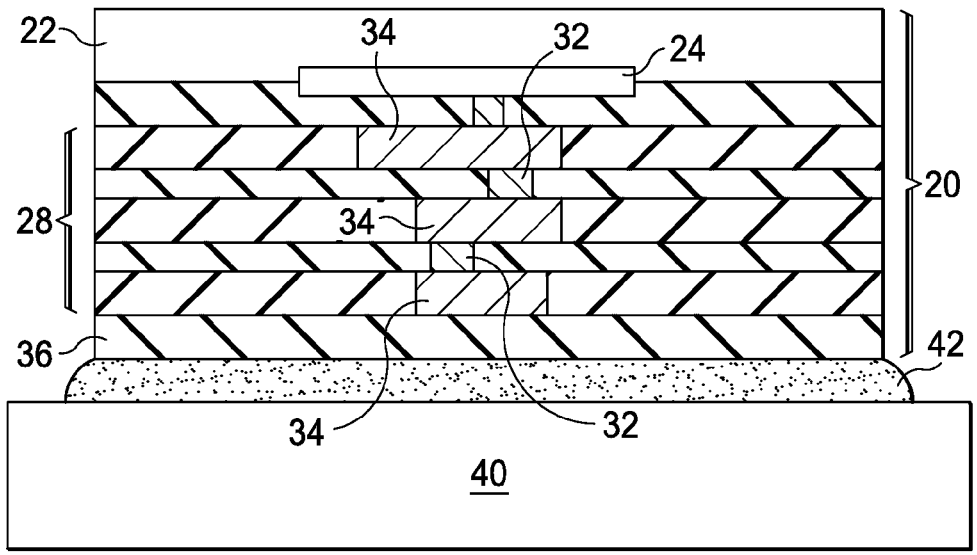

Referring to FIG. 2, the front side (the side with passivation layer 36) of image sensor wafer 20 is attached to carrier 40, for example, through adhesive 42. Alternatively, the front side of image sensor wafer 20 is attached to carrier 40 through fusion bonding by forming Si—O—Si bonds between image sensor wafer 20 and carrier 40. The backside of semiconductor substrate 22 thus faces up. A backside grinding is then performed to thin semiconductor substrate 22 to a thickness less than about 3 μm, for example, and light may penetrate semiconductor substrate 22 from the backside efficiently. In an embodiment, the original semiconductor substrate 22B (FIG. 1) is removed, while the remaining semiconductor substrate 22 includes epitaxy layer 22A as in FIG. 1.

Figure 3:
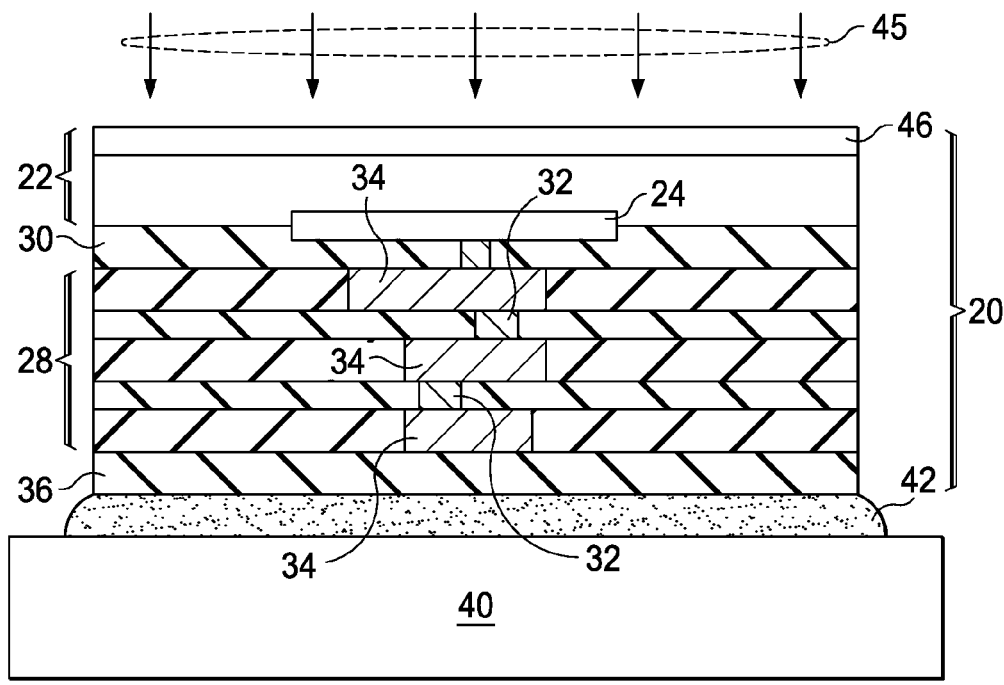

Referring to FIG. 3, an implantation is performed to dope a p-type impurity (such as boron) into a surface layer of semiconductor substrate 22. The implantation is symbolized by arrows 45. The lower portion of semiconductor substrate 22 is not doped with the p-type impurity. Throughout the description, the surface layer of semiconductor substrate 22 that is doped with the p-type impurity is referred to as p-type layer 46. The exemplary dosage of the implantation may be between about $10^{12}/cm^2$ and about $10^{15}/cm^2$, although higher or lower dosages can be used. Next, an anneal is performed to activate the implanted p-type impurity in p-type layer 46. In an embodiment, the anneal is a laser anneal, so that the p-type impurity is activated, while the devices (such as image sensors 24) that are formed at the front surface of semiconductor substrate 22 do not suffer from the thermal budget of the anneal.

Figure 4:
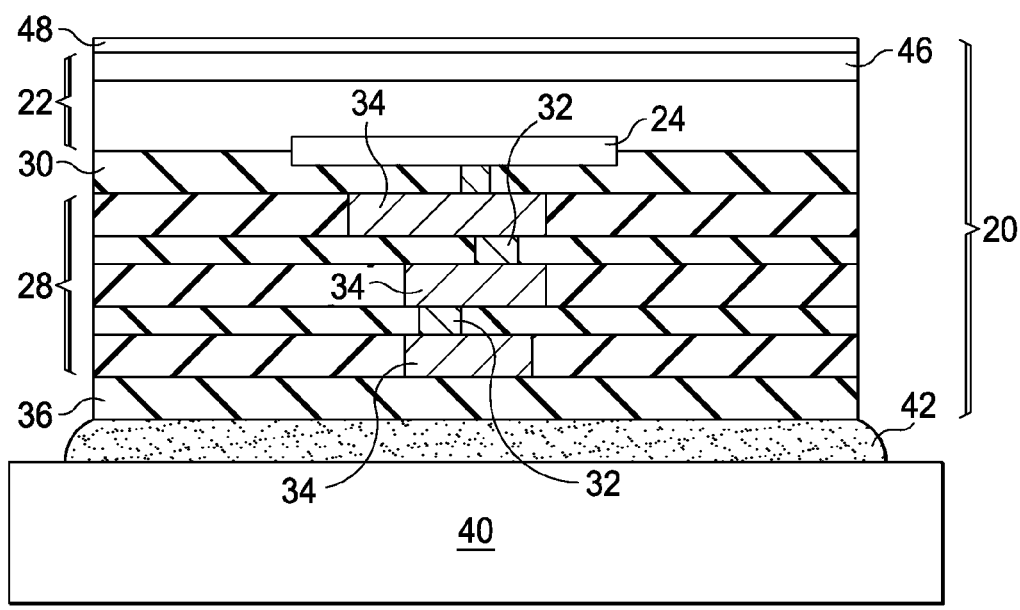

Next, as shown in FIG. 4, a surface treatment is performed on p-type layer 46. In an embodiment, the surface treatment is a dry treatment, and may be a furnace treatment performed in a furnace. During the dry treatment, the pressure in the furnace may be one atmosphere. The dry treatment may be free from plasma. The process gases (precursors) may comprise oxygen ($O_2$), nitrogen ($N_2$), and the like. Furthermore, the process gases may be free from hydrogen ($H_2$). The temperature of the treatment may be lower than about 410° C., and may be between about 250° C. and about 410° C. The duration of the treatment may be between about 2 hours and about 6 hours. In some exemplary embodiments, the flow rate of oxygen may be between about 3 slm and about 9 slm, and the flow rate of nitrogen may be between about 5 slm and about 15 slm.

After the dry treatment, thin oxide layer 48 may be formed as a result of the oxidation of an upper layer of p-type layer 46. A lower layer of p-type layer 46 remains not oxidized. Oxide layer 48 is a good-quality layer having a relatively high density. In the embodiments wherein semiconductor substrate 22 is a crystalline silicon substrate, oxide layer 48 is a silicon dioxide layer. The thickness of oxide layer 48 may be smaller than about 20 angstroms, for example.

In alternative embodiments, the surface treatment (also referred to as a plasma oxidation) may be performed in a chamber, which is configured to generate plasma using process gases that are conducted into the chamber. During the surface treatment no vertical bias perpendicular to the major surface of image sensor wafer 20 is applied. Accordingly, there is no plasma damage occurring to the surface of image sensor wafer 20. Thin oxide layer 48 may be generated as a result of the oxidation of a top layer of p-type layer 46. Similarly, oxide layer 48 is a good-quality layer having a relatively high density, and the thickness of oxide layer 48 may be smaller than about 20 angstroms, for example.

Figure 6:
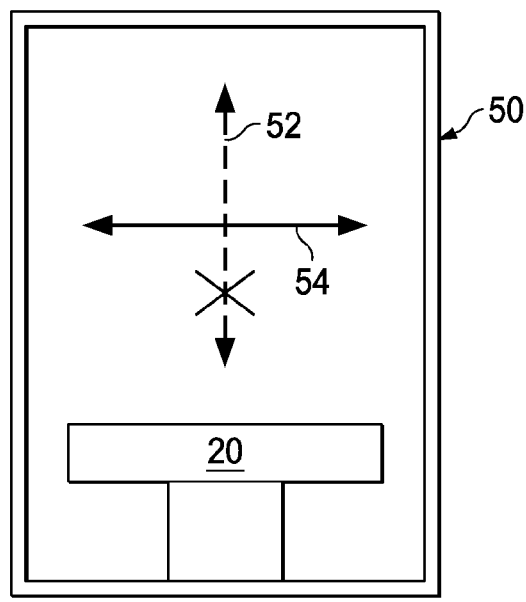
FIG. 6 illustrates a chamber for performing a plasma treatment on the BSSI image sensor wafer.

FIG. 6 schematically illustrates chamber 50 for performing the plasma treatment of wafer 20. During the plasma treatment, no vertical bias voltage is provided in a direction perpendicular to the major surface of wafer 20, which major surface are also parallel to the major surfaces of layers 46 and 48 (FIG. 4). The vertical direction is symbolized by arrows 52, which is crossed out to represent that no bias voltage is applied in the vertical direction. The plasma treatment is a low growth rate treatment. During the plasma treatment, there may be a horizontal bias (represented by arrows 54) in the horizontal direction that is parallel to the major surfaces of wafer 20 and substrate 22.

In an embodiment, in the plasma treatment, the precursors may comprise oxygen ($O_2$) and optionally hydrogen ($H_2$). It is noted that even if both oxygen and hydrogen are presented in the chamber, the plasma treatment is not a steam treatment since there is no steam generated from oxygen and hydrogen. The total pressure of oxygen and hydrogen (if any) may be between about 5 mtorr and about 15 mtorr. The partial pressure of hydrogen may be smaller than about 30 percent of the total pressure of oxygen and hydrogen (if any), and may be zero percent in some embodiments. The temperature of wafer 20 during the plasma treatment may be lower than about 410° C., and may be any temperature between the room temperature (for example, about 21° C.) and about 410° C. Accordingly, the plasma treatment may be a low-temperature treatment. The duration of the plasma treatment may be between about 30 seconds and about 360 seconds.

Figure 5:
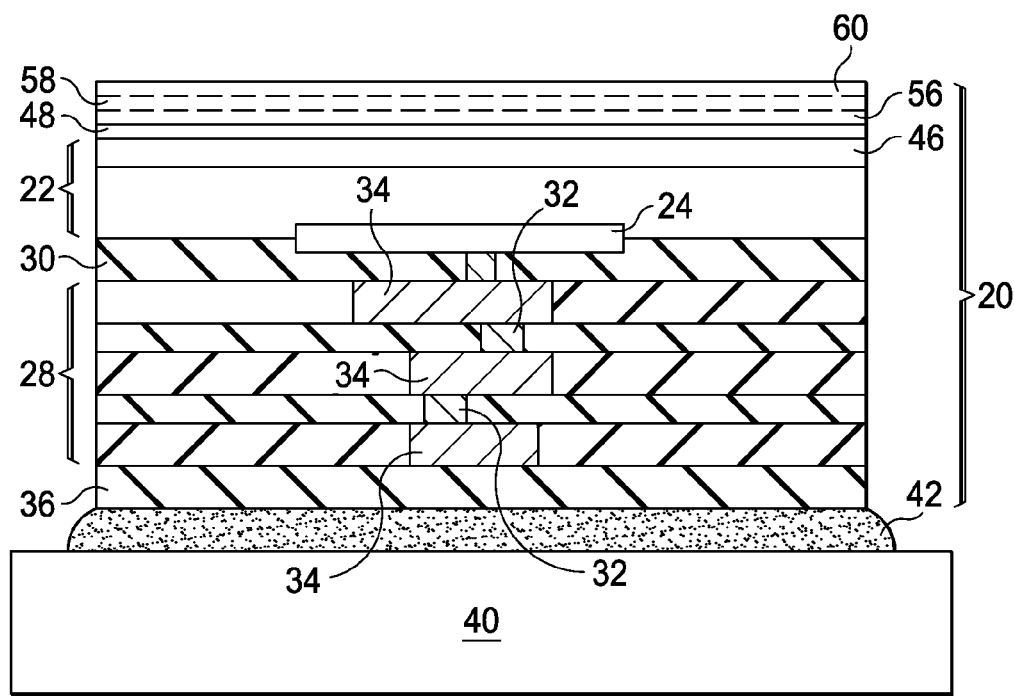

Referring to FIG. 5, after the surface treatment, buffer oxide layer 56, bottom anti-reflective coating (BARC) 58, and possibly an additional oxide layer 60 are formed. In an embodiment, buffer oxide 56 is formed using a deposition method, which may be plasma enhanced chemical vapor deposition (PECVD). BARC 58 may be formed of silicon nitride, silicon oxynitride, and/or the like. Oxide layer 60 may be formed of a chemical vapor deposition (CVD) oxide that is formed using CVD. In subsequent process steps (not shown), a patterning may be preformed to etch into buffer oxide layer 56, BARC 58 and semiconductor substrate 22 in order to form contact pads, which may be used for wire bonding. After the formation of color filters (not shown), lenses (not shown), and the wire bonding (not shown), light may be projected to penetrate through semiconductor substrate 22 and to reach image sensors 24, which are configured to convert the light into electrical signals.

In the embodiments, by replacing the conventionally used steam oxidation with a dry treatment, or with a plasma treatment that does not have vertical bias, the weak Si—H bonds that otherwise would be formed by the steam treatment are no longer formed. As a result, the pixel performance of the corresponding image sensor chips/wafers is improved, and the dark currents of the pixels in the image sensor chips/wafers are reduced.

In accordance with embodiments, a method includes performing a grinding to a backside of a semiconductor substrate, wherein a remaining portion of the semiconductor substrate has a back surface. A treatment is then performed on the back surface using a method selected from the group consisting essentially of a dry treatment and a plasma treatment. Process gases that are used in the treatment include oxygen. The plasma treatment is performed without vertical bias in a direction perpendicular to the back surface.

In accordance with other embodiments, a method includes performing a grinding on a backside of a semiconductor substrate, wherein an image sensor is disposed on a front side of the semiconductor substrate. A remaining portion of the semiconductor substrate has a back surface. A p-type impurity is implanted into a top surface layer of the backside of the semiconductor substrate to form a p-type layer. A lower portion of the semiconductor substrate below the top surface layer is not implanted. A dry treatment is performed on the p-type layer, wherein process gases used in the dry treatment comprise oxygen, and wherein substantially no hydrogen is used in the dry treatment.

In accordance with yet other embodiments, a method includes performing a grinding on a backside of a semiconductor substrate, wherein an image sensor is disposed on a front side of the semiconductor substrate. A remaining portion of the semiconductor substrate includes a back surface. A p-type impurity is implanted into a top surface layer of the backside of the semiconductor substrate to form a p-type layer. A plasma treatment is performed on the p-type layer. During the plasma treatment, substantially no vertical bias is applied in a direction perpendicular to a top surface of the p-type layer, wherein the plasma treatment is performed in process gases comprising oxygen.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    performing a grinding to a backside of a semiconductor substrate, wherein a remaining portion of the semiconductor substrate has a back surface; and
    performing a treatment on the back surface using a method selected from the group consisting essentially of a dry treatment and a plasma treatment, with an image sensor being located on a front side of the semiconductor substrate at a time the grinding is performed, wherein process gases used in the treatment comprise oxygen ($O_2$), and wherein the plasma treatment is performed without vertical bias in a direction perpendicular to the back surface.

2. The method of claim 1 further comprising, before the treatment and after the grinding, implanting a p-type impurity into a top surface layer on the backside of a remaining portion of the semiconductor substrate to form a p-type layer, wherein the treatment is performed on an exposed top surface of the p-type layer.

3. The method of claim 2 further comprising, after the step of implanting and before the step of the treatment, performing a laser anneal on the exposed top surface of the p-type layer.

4. The method of claim 1, wherein the treatment is the dry treatment, and wherein the processes gases used in the treatment comprise oxygen and nitrogen ($N_2$).

5. The method of claim 1, wherein the treatment is the plasma treatment, and wherein the processes gases used in the treatment comprise oxygen and hydrogen ($H_2$).

6. The method of claim 1, wherein the treatment is the plasma treatment, and wherein processes gases used in the treatment comprise oxygen, and are substantially free from hydrogen ($H_2$).

7. The method of claim 1 further comprising, after the step of treatment, depositing an additional oxide layer over and contacting an oxide layer formed during the step of treatment.

8. The method of claim 1, wherein the dry treatment is performed in a furnace under a pressure of one atmosphere.

9. A method comprising:
    performing a grinding on a backside of a semiconductor substrate, wherein a remaining portion of the semiconductor substrate comprises a back surface, and wherein an image sensor is disposed on a front side of the semiconductor substrate;
    implanting a p-type impurity into a top surface layer of the backside of a remaining portion of the semiconductor substrate to form a p-type layer, wherein a lower portion of the semiconductor substrate below the top surface layer is not implanted; and
    performing a dry treatment on the p-type layer, wherein process gases used in the dry treatment comprise oxygen, and wherein substantially no hydrogen ($H_2$) is used in the dry treatment.

10. The method of claim 9, wherein the dry treatment is performed in a furnace under a pressure of one atmosphere.

11. The method of claim 9, wherein the process gases used in the dry treatment further comprise nitrogen.

12. The method of claim 9 further comprising, after the step of implanting and before the dry treatment, performing a laser anneal on an exposed top surface of the p-type layer.

13. The method of claim 9, wherein an oxide layer having a thickness less than about 20 angstrom is generated by the dry treatment, and wherein the oxide layer is converted from an oxidized surface portion of the p-type layer.

14. The method of claim 13 further comprising, after the dry treatment, depositing an additional oxide layer over the oxide layer.

15. A method comprising:
    performing a grinding on a backside of a semiconductor substrate, wherein a remaining portion of the semiconductor substrate comprises a back surface, and wherein an image sensor is disposed on a front side of the semiconductor substrate;
    implanting a p-type impurity into a top surface layer of the backside of a remaining portion of the semiconductor substrate to form a p-type layer; and
    performing a plasma treatment on the p-type layer, wherein during the plasma treatment, substantially no vertical bias is applied in a direction perpendicular to a top surface of the p-type layer, and wherein the plasma treatment is performed in process gases comprising oxygen ($O_2$).

16. The method of claim 15, wherein the process gases of the plasma treatment further comprise hydrogen ($H_2$).

17. The method of claim 15, wherein the plasma treatment is performed in a chamber substantially free from hydrogen.

18. The method of claim 15, wherein an oxide layer having a thickness less than about 20 angstrom is generated by the plasma treatment, and wherein the oxide layer is converted from an oxidized surface portion of the p-type layer.

19. The method of claim 15 further comprising, after the plasma treatment, depositing an additional oxide layer over the oxide layer.

20. The method of claim 15 further comprising, after the step of implanting and before the step of the plasma treatment, performing a laser anneal on an exposed top surface of the p-type layer.

* * * * *